(12) United States Patent
Preiss et al.

(10) Patent No.: US 10,870,438 B2
(45) Date of Patent: Dec. 22, 2020

(54) POWER CAR FOR HIGH-SPEED TRAIN WITH INTERNAL OVERPRESSURE

(71) Applicant: SpeedInnov, Paris (FR)

(72) Inventors: Paul Preiss, Reichshoffen (FR); Pierre Debost, Genevilliers (FR); Etienne Grappein, Uffholtz (FR); Marion Faverger, Belfort (FR)

(73) Assignee: SPEEDINNOV, Paris (FR)

( * ) Notice: Subject to any disclaimer, the term of this patent is extended or adjusted under 35 U.S.C. 154(b) by 219 days.

(21) Appl. No.: 16/117,951

(22) Filed: Aug. 30, 2018

(65) Prior Publication Data

US 2019/0061787 A1    Feb. 28, 2019

(30) Foreign Application Priority Data

Aug. 30, 2017  (FR) ..................................... 17 58004

(51) Int. Cl.
*B61C 17/04*    (2006.01)
*B61C 3/00*    (2006.01)
(Continued)

(52) U.S. Cl.
CPC .............. *B61C 17/04* (2013.01); *B61C 3/00* (2013.01); *B61D 27/009* (2013.01);
(Continued)

(58) Field of Classification Search
CPC ......... B61C 17/00; B61C 17/02; B61C 17/04; B61C 3/00; B61D 27/0018; B61D 27/0027; B61D 27/009; H02K 9/04
See application file for complete search history.

(56) References Cited

U.S. PATENT DOCUMENTS 4,907,645 A * 3/1990 Dumas ...................... B61C 5/02
165/41
5,544,012 A * 8/1996 Koike ................ H05K 7/20572
361/695
(Continued)

FOREIGN PATENT DOCUMENTS

EP        0625456      11/1994
FR        2703967      10/1994
(Continued)

OTHER PUBLICATIONS

Preliminary Search Report for FR 1758004, dated Feb. 12, 2018.

*Primary Examiner* — Jason C Smith
(74) *Attorney, Agent, or Firm* — B. Aaron Schulman, Esq.; Stites & Harbison, PLLC

(57) ABSTRACT

The present invention relates to a power car (10) for a high-speed train, comprising a body (12) and at least one power car of said body,
  said body comprising a roof (19) and a floor (20); the traction motor being arranged below said floor,
  the body further comprising an equipment room (24) defined between said roof and said floor,
  said technical room including: electrical equipment (33) for controlling the traction motor; and at least one fan device (34) of said electrical equipment.
The ventilation device comprises: an air intake sheath (36), forming a closed pipe between an inlet (38) and an outlet (40) open on the equipment room; and a fan (42) arranged between the inlet and the outlet, so as to create an overpressure in the technical room.

9 Claims, 2 Drawing Sheets

(51) Int. Cl.
 *H05K 7/20* (2006.01)
 *H02K 9/04* (2006.01)
 *B61D 27/00* (2006.01)
(52) U.S. Cl.
 CPC ........... *B61D 27/0018* (2013.01); *H02K 9/04* (2013.01); *H05K 7/20909* (2013.01)

(56) References Cited

U.S. PATENT DOCUMENTS

| | | | | |
|---|---|---|---|---|
| 6,238,282 | B1* | 5/2001 | Kindel | B60H 1/00564 |
| | | | | 454/84 |
| 6,431,081 | B2* | 8/2002 | Mary | B61C 17/04 |
| | | | | 105/59 |
| 2013/0252527 | A1 | 9/2013 | Tscheng et al. | |
| 2014/0346287 | A1* | 11/2014 | Billig | B61L 3/127 |
| | | | | 246/187 A |
| 2015/0158504 | A1* | 6/2015 | Do | B61D 27/009 |
| | | | | 454/84 |
| 2015/0191182 | A1* | 7/2015 | Abou Eid | F25D 21/06 |
| | | | | 62/80 |
| 2016/0134177 | A1* | 5/2016 | Itoh | B61C 3/00 |
| | | | | 105/59 |
| 2017/0167083 | A1* | 6/2017 | Hansen | B61C 17/04 |
| 2018/0251138 | A1* | 9/2018 | Debost | B61C 3/00 |
| 2019/0061786 | A1* | 2/2019 | Preiss | B61D 27/0018 |
| 2019/0061787 | A1* | 2/2019 | Preiss | B61D 27/0018 |
| 2019/0185023 | A1* | 6/2019 | Zueger | B61C 7/04 |

FOREIGN PATENT DOCUMENTS

| | | |
|---|---|---|
| JP | 2009234310 | 10/2009 |
| WO | WO-2012060139 | 5/2012 |

* cited by examiner

POWER CAR FOR HIGH-SPEED TRAIN WITH INTERNAL OVERPRESSURE

CROSS REFERENCE

This application claims the benefit of French Patent Application FR 17 58004, filed on Aug. 30, 2017 and hereby incorporated by reference herein.

TECHNICAL FIELD OF THE INVENTION

The present invention relates to a power car for a high-speed train, of the type comprising a body and at least one traction motor for said body; said body comprising a roof and a floor; the at least one traction motor being arranged below said floor, the body further comprising a technical room defined between said roof and said floor, said technical room including: electrical equipment for controlling the at least one traction motor; and at least one first ventilation device for said electrical equipment.

The invention in particular applies to transporting passengers. A high-speed train includes one or several power cars, most often one at each raft end, and a certain number of passenger cars.

BACKGROUND OF THE INVENTION

In the current high-speed trains, the ventilation of the electrical equipment of the power cars is provided through aeration orifices arranged inside walls of said power cars. The movement of the raft generates a flow of air that cools said electrical equipment. However, such a ventilation system exposes the electrical equipment to outside dust, humidity, or even snow.

It is also known, in particular from document US2013/0252527, to equip railway vehicles with electric fans. The known systems, however, impose constraints on the architecture of the power car.

The present invention aims to improve the existing devices, by providing a ventilation system for the electrical equipment, while optimizing the quality of the inside air and making it possible to improve the design of the power car.

SUMMARY OF THE INVENTION

To that end, the invention relates to a power car for a high-speed train of the aforementioned type, wherein the first ventilation device comprises: a first air intake sheath, forming a closed pipe between an inlet and an outlet open on the equipment room; and a first fan arranged between the inlet and the outlet of said first sheath, so as to create an overpressure in the technical room.

According to other advantageous aspects of the invention, the power car includes one or more of the following features, considered alone or according to all technically possible combinations:
    the inlet of the first sheath is arranged in line with a first air inlet mouth located on the roof of the body, and the first ventilation device comprises a first filtration member arranged at the inlet of the first sheath, said first filtration member being permeable to air and able to retain solid particles with dimensions larger than a first threshold;
    the first filtration member comprises deflector elements of the louver type;
    the deflector elements define air inlet channels arranged along a direction perpendicular to a main movement direction of the power car;
    the first ventilation device comprises a second filtration member, arranged in the first sheath between the first filtration member and the first fan, said second filtration member being permeable to air and able to retain solid particles with dimensions larger than a second threshold, said second threshold being lower than the first threshold;
    the second filtration member comprises a panel made from a textile material;
    the first ventilation device further comprises at least one air outlet mouth, located on the roof of the body and in fluid communication with the equipment room;
    the body further comprises at least one second ventilation device separate from the first ventilation device, said second ventilation device comprising: a second air intake sheath, forming a closed pipe between an inlet and an outlet open on the equipment room; and a second fan arranged between the inlet and the outlet of said sheath, the first and second sheaths being located close to opposite ends of the body.

BRIEF DESCRIPTION OF THE DRAWINGS

The invention will be better understood upon reading the following description, provided solely as a non-limiting example and done in reference to the drawings, in which.

DETAILED DESCRIPTION OF SOME EMBODIMENTS

Figure 1:
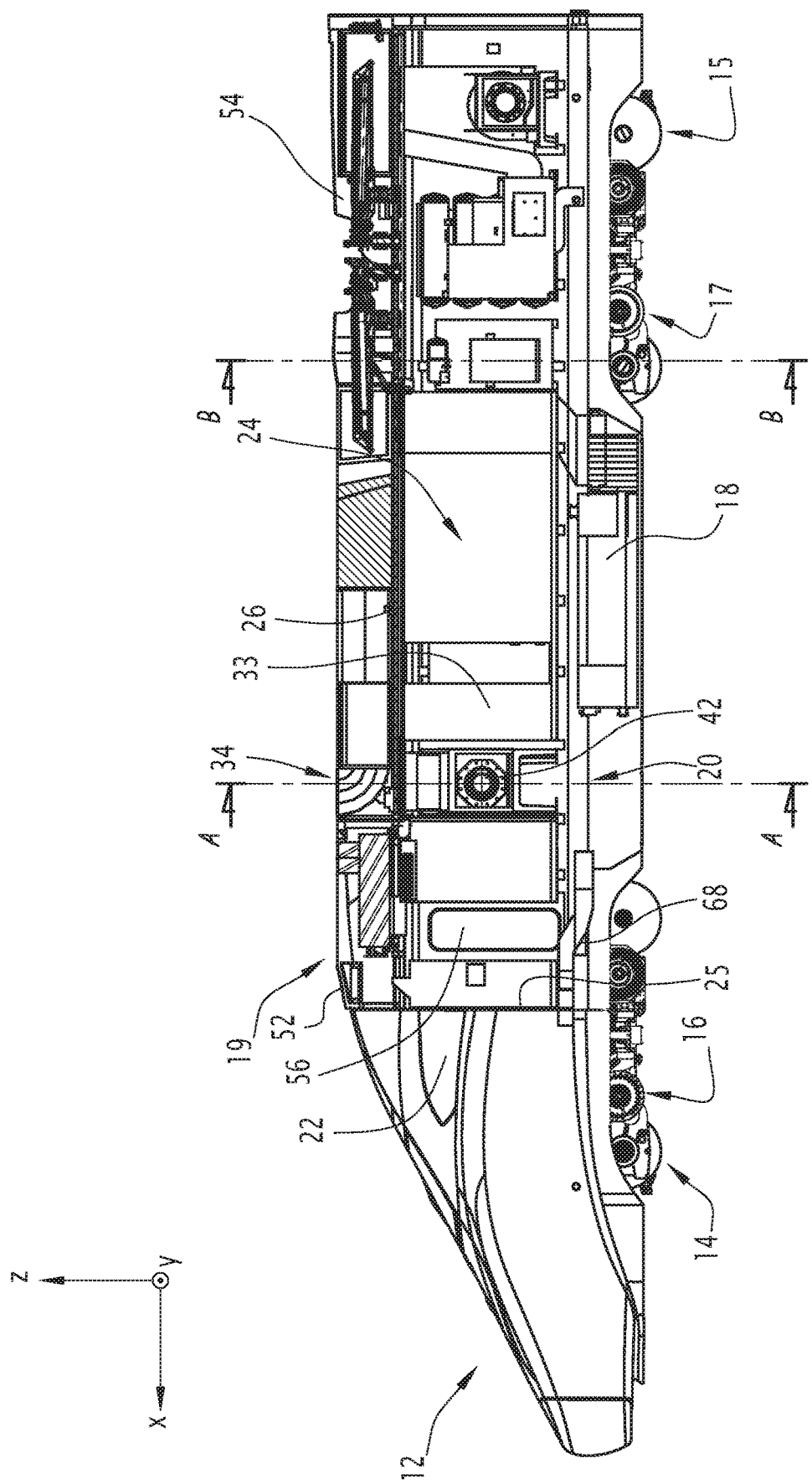
FIG. 1 is a partial longitudinal sectional view of a power car according to one embodiment of the invention.

FIG. 1 shows a power car 10 of a high-speed train, according to one embodiment of the invention. The power car 10 is intended to be assembled to railway vehicles of the passenger transport car type, to form a train.

The power car 10 includes a body 12, as well as two bogies 14, 15 and two traction motors 16, 17, arranged below said body 12. Each traction motor 16, 17 is intended to set the wheels of one of the bogies 14, 15 in motion. The power car 10 further includes an electric transformer 18, connected to the traction motors 16, 17 and also arranged below the body 12.

The body 12 comprises a roof 19 and a floor 20, which vertically delimit said body. The bogies 14, 15 and the traction motors 16, 17 are arranged below the floor 20. The body 12 further comprises side walls 21.

The body 12 has an elongated shape. An orthonormal coordinate system (X, Y, Z) is considered, the direction Z representing the vertical. The body 12 extends primarily along the direction X, corresponding to a typical movement direction of the power car 10. The body 12 comprises a front end, formed by a driving cabin 22.

The first bogie 14 and a first traction motor 16 are located close to said front end of the body 12. A second bogie 15 and a second traction motor 17 are located close to an opposite rear end of the body 12.

Adjacent to the driving cabin 22 along X, the body 12 comprises an equipment compartment 24, also called equipment room. Said equipment compartment is separated from the driving cabin 22 by a partition 25. The equipment compartment 24 is shown in sectional view in FIG. 1.

Figure 2:
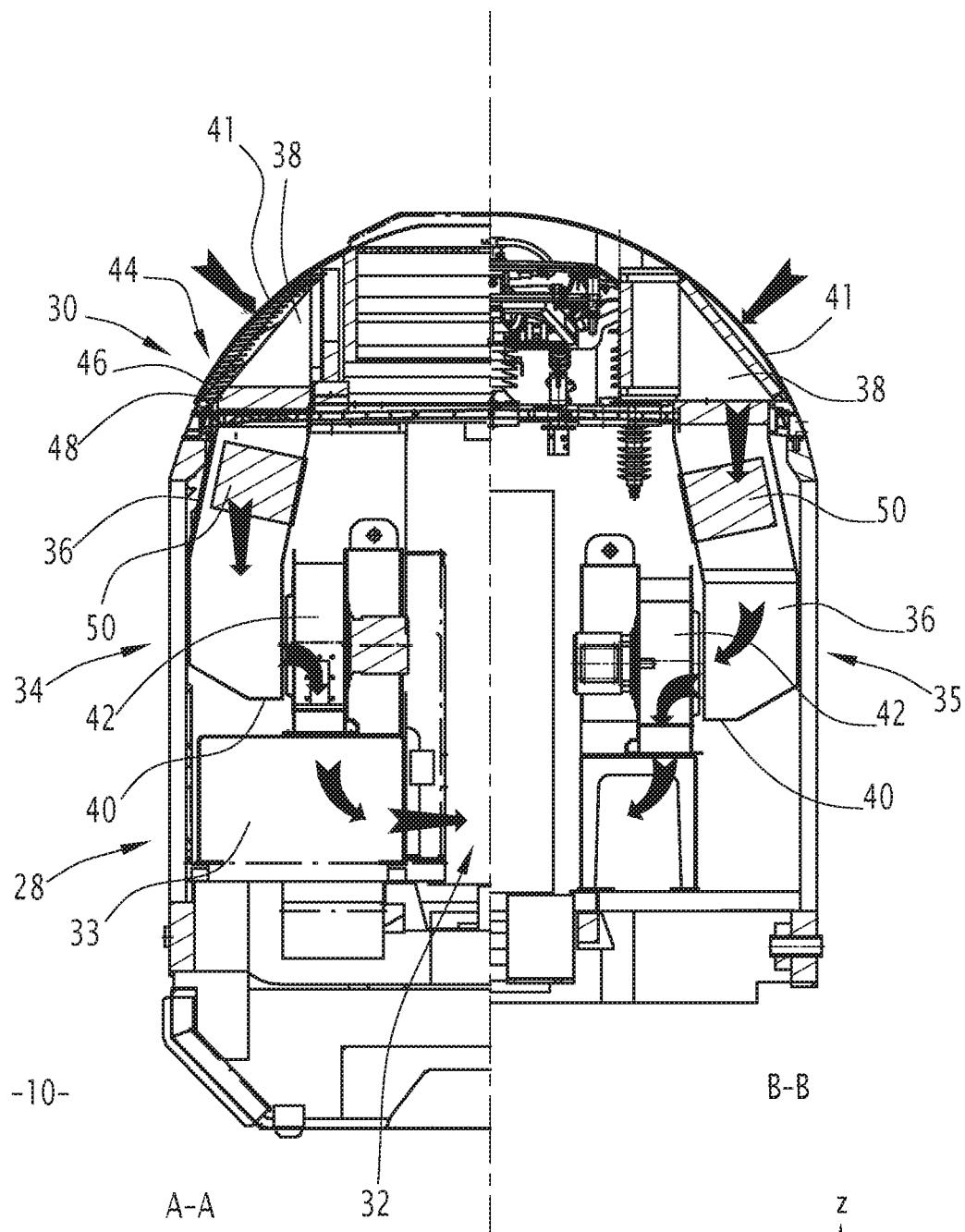
FIG. 2 is a cross-sectional view of the power car of FIG. 1, the left and right parts respectively showing the front and back of the equipment room.

The left part of FIG. 2 shows a cross-sectional view of the body 12, at the front of said equipment compartment 24, along a cutting plane A-A indicated in FIG. 1. The right part of FIG. 2 shows a cross-sectional view of the body 12, at the back of said equipment compartment 24, along a cutting plane B-B indicated in FIG. 1.

In a plane (X, Z), the equipment compartment 24 is delimited by the roof 19, the floor 20 and the side walls 21. The equipment compartment 24 comprises a ceiling 26, which divides it along Z between a lower level 28 and an upper level 30. The ceiling 26 in particular marks a boundary along Z between the side walls 21 and the roof 19, said side walls 21 being substantially planar and vertical and said roof 19 having a domed shape.

The lower level 28 of the equipment room 24 comprises a central corridor 32 and a plurality of pieces of technical equipment, installed on either side of said central corridor near the side walls 21. Said equipment rooms will be described below.

Advantageously, the central corridor 32 has a width along Y between 500 mm and 750 mm, preferably equal to about 750 mm. This width is determined to allow an operator to pass comfortably, without significantly limiting the available space for the equipment of the power car.

The lower level 28 of the equipment compartment 24 comprises at least one traction box 33. Said traction box 33 includes electrical and/or electronic equipment for controlling the traction motors 16, 17.

The lower level 28 of the equipment compartment 24 comprises at least one first ventilation device 34. Said first ventilation device 34 makes it possible to inject cool air inside said lower level 28, in particular in order to cool the electrical and/or electronic equipment of the at least one traction box 33.

The first ventilation device 34 is arranged substantially at the front of the equipment compartment 24, near the first bogie 14. Preferably, the lower level 28 further comprises a second ventilation device 35, arranged substantially behind the equipment compartment 24 near the second bogie 15 and the second traction motor 17. The first 34 and second 35 ventilation devices are visible in FIG. 2. The description below also applies to the first 34 and second 35 ventilation devices, the elements shared by said devices being designated using the same reference numbers.

The ventilation devices 34, 35 comprise an air intake sheath 36. Said sheath 36 forms a closed conduit, with the exception of an inlet 38 and an outlet 40.

The inlet 38 of the sheath is arranged in line with the roof 19 of the body 12. More specifically, the inlet 38 is formed by a first air inlet mouth 41, incorporated into the roof 19.

From the inlet 38, the sheath 36 extends in the upper level 30 of the equipment compartment 24, passes through the ceiling 26 and continues to the outlet 40, arranged in the lower level 28.

The ventilation device 34, 35 further comprises an electric fan 42, located in the lower level 28 at the outlet 40. The fan 42 is able to inject air from outside the body 12 into the lower level 28, so as to create a slight overpressure inside said lower level.

The ventilation device 34, 35 further comprises a first filtration member 44, arranged at the inlet 38 of the sheath 36. The first ventilation device 44 is permeable to air and able to retain solid particles with dimensions larger than a first threshold. For information, said first threshold is comprised between 80 micrometers and 120 micrometers; typically, said first threshold is 90 micrometers.

Preferably, the first filtration member 44 comprises mechanical deflector elements, such as louvers 46. Said louvers 46 define channels 48 that form the inlet 38 of the sheath 36. Preferably, said channels 48 are arranged along the transverse direction Y, or perpendicular to the main movement direction X of the power car 10.

The louvers 46 thus make it possible to limit the penetration of drops of water and particles of dust into the inlet 38 of the sheath 36, during the movement of the power car 10.

The ventilation device 34, 35 further comprises a second filtration member 50. Said second filtration member is arranged in the sheath 36, between the first filtration member 44 and the fan 42. The second filtration member 50 is permeable to air and able to retain solid particles with dimensions larger than a second threshold, said second threshold being smaller than the first threshold. For information, said second threshold is comprised between 50 micrometers and 80 micrometers.

Preferably, the second filtration member 50 comprises a panel made from a textile material, or another material that is permeable to air, arranged through the sheath 36. The second filtration member 50 is intended to provide optimal prevention of the dust in the lower stage 28 of the equipment compartment 24.

The ventilation device 34, 35 further comprises at least one air outlet mouth 52, 54, located on the roof 19 of the body 12 and in fluid communication with the lower level 28 of the equipment compartment 24. The overpressure generated by the fan 42 in the equipment compartment 24, relative to the outside of the body 12, prevents dust from penetrating through said air outlet mouth 52, 54. Alternatively, the air outlet mouth 52, 54 is not provided with a filter.

In the embodiment shown in FIG. 1, the body 12 comprises a first 52 and second 54 air outlet mouth, respectively located in front of and behind the roof 19.

The aspiration of the air from the roof 19 instead of aspiration on the side walls 21 in particular makes it possible to reduce the noise with respect to the outside.

The equipment compartment 24 comprises at least one opening arranged in a side wall 21 and closed off reversibly by a door 56. Said door 56 provides access from the outside of the central corridor 32 of the lower level 28. Preferably, the side walls 21 do not comprise any permanently clear opening. Aside from limiting the pollution of the equipment compartment 24, such side walls with no opening are more aesthetically pleasing and allow greater design freedom.

With the two ventilation devices 34 and 35, it is possible to operate the fans 42 at a reduced speed in order to create a slight overpressure in the equipment compartment 24, as described above.

Furthermore, when the technical equipment from the equipment room 24 heats the atmosphere inside said equipment compartment, the fans 42 operate at full speed in order to discharge the calories to the outside.

The invention claimed is:

1. A power car for a high-speed train, said power car comprising a body and at least one traction motor of said body, a roof and a floor; the at least one traction motor being arranged under said floor, and an equipment room defined between said roof and said floor, wherein said equipment room comprises electrical equipments for controlling the at least one traction motor; and at least a first ventilation device of said electrical equipments, and wherein the first ventilation device comprises a first air intake sheath, forming a closed pipe between an inlet and an outlet open onto the equipment room; and a first fan arranged between the inlet and the outlet of said first sheath, so as to create an overpressure in the equipment room.

2. The power car for a high-speed train according to claim 1, wherein:
the inlet of the first sheath is arranged at the level of a first air inlet mouth located on the roof of the body, and
the first ventilation device comprises a first filtration member arranged at the inlet of the first sheath, said first filtration member being permeable to air and able to retain solid particles with dimensions larger than a first threshold.

3. The power car for a high-speed train according to claim 2, wherein the first filtration member comprises deflector elements of the louver type.

4. The power car for a high-speed train according to claim 3, wherein the deflector elements define air inlet channels arranged along a direction perpendicular to a main movement direction of the power car.

5. The power car for a high-speed train according to claim 1, wherein the first ventilation device comprises a second filtration member, arranged in the first sheath between the first filtration member and the first fan, said second filtration member being permeable to air and able to retain solid particles with dimensions larger than a second threshold, said second threshold being lower than the first threshold.

6. The power car for a high-speed train according to claim 5, wherein the second filtration member comprises a panel made from a textile material.

7. The power car for a high-speed train according to claim 1, wherein the first ventilation device further comprises at least one air outlet mouth, located on the roof of the body and in fluid communication with the equipment room.

8. The power car for a high-speed train according to claim 1, wherein the body further comprises at least a second ventilation device separate from the first ventilation device, said second ventilation device comprising: a second air intake sheath, forming a closed pipe between an inlet and an outlet open onto the equipment room; and a second fan arranged between the inlet and the outlet of said sheath, the first and second sheaths being located close to opposite ends of the body.

9. The power car for a high-speed train according to claim 1 wherein the train transports passengers.

* * * * *